United States Patent
Marshall et al.

(10) Patent No.: US 9,444,615 B2
(45) Date of Patent: Sep. 13, 2016

(54) LOW LATENCY DIGITAL JITTER TERMINATION FOR REPEATER CIRCUITS

(75) Inventors: Andrew Marshall, Kanata (CA); Henry Wong, Ottawa (CA); Essaid Bensoudane, Ottawa (CA)

(73) Assignee: Semtech Canada Corporation, Burlington, Ontario ( * ) Notice: Subject to any disclaimer, the term of this patent is extended or adjusted under 35 U.S.C. 154(b) by 0 days.

(21) Appl. No.: 14/235,242

(22) PCT Filed: Jul. 25, 2011

(86) PCT No.: PCT/CA2011/050452
§ 371 (c)(1),
(2), (4) Date: Nov. 17, 2014

(87) PCT Pub. No.: WO2013/013287
PCT Pub. Date: Jan. 31, 2013

(65) Prior Publication Data
US 2015/0146834 A1    May 28, 2015

(51) Int. Cl.
*H04L 7/033* (2006.01)
*H04L 7/00* (2006.01)
*H03L 7/08* (2006.01)
*H04L 25/20* (2006.01)

(52) U.S. Cl.
CPC ............ *H04L 7/0331* (2013.01); *H03L 7/0807* (2013.01); *H04L 7/0025* (2013.01); *H04L 7/033* (2013.01); *H04L 7/005* (2013.01); *H04L 25/20* (2013.01)

(58) Field of Classification Search
CPC ... H03L 7/0807; H04L 7/0025; H04L 7/005; H04L 7/033; H04L 7/0331; H04L 25/20
See application file for complete search history.

(56) References Cited

U.S. PATENT DOCUMENTS

| | | | |
|---|---|---|---|
| 6,907,541 B1 * | 6/2005 | Padmanabhan et al. ..... | 713/503 |
| 7,203,259 B2 * | 4/2007 | Glenn ................... | H03L 7/0812 |
| | | | 327/141 |
| 7,355,652 B2 * | 4/2008 | Gudmondson ........... | H03L 7/06 |
| | | | 348/441 |
| 7,439,788 B2 * | 10/2008 | Law ........................ | H03L 7/07 |
| | | | 327/231 |
| 7,835,425 B1 | 11/2010 | Sutardja et al. | |
| 8,270,552 B1 * | 9/2012 | Oner ............................. | 375/354 |
| 2006/0083343 A1 * | 4/2006 | Roederer ................ | H04L 7/033 |
| | | | 375/375 |
| 2011/0150159 A1 | 6/2011 | Ali et al. | |

FOREIGN PATENT DOCUMENTS

WO          01/95629 A2    12/2001
WO    WO 2010/103576    *  9/2010  ............. H04L 25/02

OTHER PUBLICATIONS

ISR and Written opinion for International Appl. No. PCT/CA2011/050452 dated Jan. 12, 2012.

* cited by examiner

*Primary Examiner* — Sophia Vlahos
(74) *Attorney, Agent, or Firm* — Renner, Kenner; Arthur M. Reginelli

(57) ABSTRACT

A circuit for reducing jitter in a digital signal is provided, comprising a clock and data recovery stage operative to receive an input data signal and generate in response thereto a recovered data signal, a recovered clock signal, and an unfiltered interpolator code; a filter stage operative to receive the unfiltered interpolator code and generate in response thereto a filtered clock signal; and a memory component operative to receive the recovered data signal, the recovered clock signal, and the filtered clock signal; sample the recovered data signal using the recovered clock signal; store the resulting sampled bits; and generate an output data signal by selecting stored bits using the filtered clock signal.

21 Claims, 8 Drawing Sheets

LOW LATENCY DIGITAL JITTER TERMINATION FOR REPEATER CIRCUITS

TECHNICAL FIELD

This disclosure relates to the field of jitter termination in digital communications.

BACKGROUND

A repeater circuit in a digital communication system generally operates as an intermediate node in the course of transmitting a signal from an origin node to a destination node. The repeater receives a digital signal transmitted from the origin node via the first link of a transmission medium, such as an electrical cable, and outputs a modified version of the input signal via a second link to the destination node (which may be a further repeater). The modifications made to the signal by the repeater are generally intended to eliminate analog artifacts introduced to the signal by the first link of the transmission medium, such as signal attenuation or phase jitter, and generally to improve the scan input (SI) of the communication link.

A repeater or destination node in such a system is able to track relatively low-frequency jitter on an incoming data signal. The clock signal used to sample the input data signal is extracted from the input data signal and incorporates the same low-frequency jitter as the input data signal. This effectively eliminates the possibility of bit sampling errors. However, the output signal created by this method of sampling also contains the same jitter contained in the input data signal. In the case of a repeater signal, this means that the low-frequency jitter is transferred to the destination node as part of the output signal of the repeater. If additional jitter is then introduced by the second link in the transmission (between the repeater and the destination node), the total amount of jitter reaching the destination node may exceed the destination node's jitter tolerance, resulting in bit errors in sampling at the destination.

Thus, when a traditional repeater is inserted in a link, the jitter budget in the second portion of the link (downstream from the repeater) is influenced by how much jitter is transferred by the repeater. Traditional repeaters track and transfer jitter with the same bandwidth. This makes the amount of jitter in the second half of the link unpredictable and potentially disruptive.

Repeater circuits have been made that incorporate additional jitter termination components designed to filter this low-frequency jitter out of the output signal, thereby decoupling jitter tracking and jitter transfer and resulting in a cleaner output signal to the destination node. However, these jitter termination mechanisms for repeater circuits typically make use of expensive filter components such as phase-locked loops (PLLs) which occupy a large area on a circuit die and introduce additional analog artifacts that can reduce jitter tolerance at commonly-encountered frequencies.

BRIEF SUMMARY OF THE INVENTION

This application is directed to a method and device for reducing jitter in a digital signal. In a first aspect, the invention provides a circuit for reducing jitter in a digital signal, comprising a clock and data recovery stage operative to receive an input data signal and generate in response thereto a recovered data signal, a recovered clock signal, and an unfiltered interpolator code; a filter stage operative to receive the unfiltered interpolator code and generate in response thereto a filtered clock signal; and a memory component operative to receive the recovered data signal, the recovered clock signal, and the filtered clock signal; sample the recovered data signal using the recovered clock signal; store the resulting sampled bits; and generate an output data signal by sampling stored bits using the filtered clock signal.

In a second aspect, the unfiltered interpolator code encodes the change in phase of the input data signal over time.

In a further aspect, the clock and data recovery stage receives the input data signal from a first communication link and the memory component relays the output data signal to a second communication link.

In a further aspect, the recovered data signal encodes the data carried on the input data signal.

In a further aspect, the recovered clock signal has a phase matching the phase of the recovered data signal.

In a further aspect, the memory component stores bits sampled from the recovered data signal at an input end of a first-in-first-out queue of memory registers.

In a further aspect, the memory component samples stored bits for the output data signal by sampling from an output end of the first-in-first-out queue of memory registers using the filtered clock signal.

In a further aspect, the clock data and recovery stage comprises a data recovery stage operative to receive the input data signal and generate in response thereto the recovered data signal; a phase aligner operative to receive the input data signal and generate in response thereto the unfiltered interpolator code; and a first phase interpolator stage operative to receive the unfiltered interpolator code and generate in response thereto the recovered clock signal.

In a further aspect, the filter stage comprises a digital low-pass filter operative to receive the unfiltered interpolator code and generate in response thereto a filtered interpolator code, and a second phase interpolator operative to receive the filtered interpolator code and generate in response thereto a filtered clock signal encoding the clock signal of the input data signal filtered of phase jitter.

In a further aspect, the filtered interpolator code encodes the unfiltered interpolator code with high-frequency components removed.

In a further aspect, the invention further provides a timebase clock used by the first phase interpolator and the second phase interpolator to generate the recovered clock signal and the filtered clock signal, respectively.

In a further aspect, the invention provides a method for reducing jitter in a digital signal, comprising receiving an input data signal; generating a recovered data signal, a recovered clock signal, and an unfiltered interpolator code in response to the input data signal; generating a filtered clock signal based on the unfiltered interpolator code; sampling the recovered data signal using the recovered clock signal and storing the resulting sampled bits in the memory component; and generating an output data signal by sampling stored bits using the filtered clock signal.

In a further aspect, the unfiltered interpolator code encodes the change in phase of the input data signal over time.

In a further aspect, the input data signal is received from a first communication link and comprising the further step of relaying the output data signal to a second communication link.

In a further aspect, the recovered data signal encodes the data carried on the input data signal.

In a further aspect, the recovered clock signal has a phase matching the phase of the recovered data signal.

In a further aspect, the step of storing sampled bits comprises storing sampled bits at an input end of a first-in-first out queue of memory registers.

In a further aspect, the step of sampling stored bits comprises sampling stored bits from an output end of the first-in-first out queue of memory registers using the filtered clock signal.

In a further aspect, the step of generating a recovered data signal, a recovered clock signal, and an unfiltered interpolator code comprises generating the recovered data signal based on the input data signal; using a phase aligner to generate the unfiltered interpolator code based on the input data signal; and using a first phase interpolator to generate the recovered clock signal based on the unfiltered interpolator code.

In a further aspect, the step of generating a filtered clock signal comprises using a digital low-pass filter to receive the unfiltered interpolator code and generate in response thereto a filtered interpolator code, and using a second phase interpolator to receive the filtered interpolator code and generate in response thereto a filtered clock signal encoding the clock signal of the input data signal filtered of phase jitter.

In a further aspect, the first phase interpolator and the second phase interpolator use a timebase clock to generate the recovered clock signal and the filtered clock signal, respectively.

Other aspects and features of the present invention will become apparent to those ordinarily skilled in the art upon review of the following description of specific embodiments of the invention in conjunction with the accompanying figures.

DETAILED DESCRIPTION OF EXAMPLE EMBODIMENTS

Example embodiments described herein include a low latency mechanism to decouple jitter tracking from jitter transfer, effectively terminating jitter and decreasing the amount of jitter passed on by a repeater, thereby improving jitter budget in a downstream link compared to a traditional repeater. Example embodiments of the mechanism described herein may for example be suited for use with various data communication systems, including Serial Digital Interface (SDI). For some applications, the example embodiments described herein can be configured to provide jitter termination with less than 10 UI (clock cycles) of latency, and to provide up to 1.5 UI of jitter termination down to 700 KHz.

Figure 1:
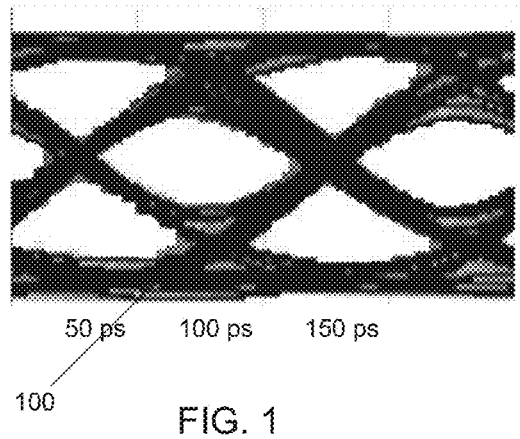
FIG. 1 is an eye diagram of an example input data signal received by an example repeater.
Figure 2:
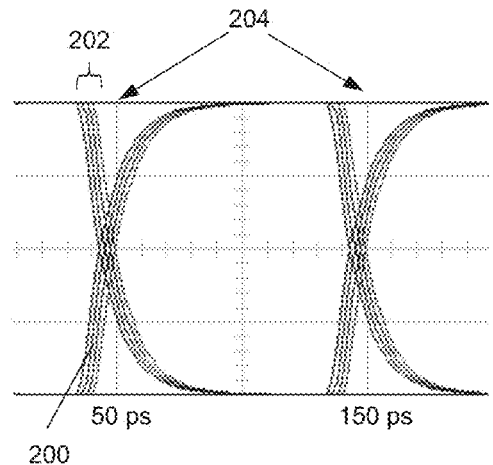
FIG. 2 is an eye diagram of an example output data signal generated by an example traditional repeater.

In order to provide a better understanding of example embodiments, a general description of repeater circuits will be provided before going into the specific features of the present invention. A traditional repeater circuit in a typical data communication system receives an input signal that has been transmitted from an origin node through a transmission medium. FIG. 1 is an eye diagram of an example input signal 100, showing significant distortion and collapse of the digital signal with bit transitions becoming unclear. The traditional repeater extracts from the input signal 100 a recovered clock signal, which is then used to sample the input signal at the center of each recovered clock cycle in order to generate a recovered data signal. FIG. 2 is an eye diagram of an example recovered data signal 200 generated by an example traditional repeater, exhibiting much less collapse and distortion than the input signal of FIG. 1. At this stage, any high-frequency jitter present in the input signal may result in bit errors in generating the recovered data signal, due to sampling errors wherever the jitter causes a bit transition to deviate past the midpoint of its clock cycle. However, most high-frequency jitter whose magnitude is too low to generate such bit errors is not captured in the recovered clock signal or the recovered data signal. Low-frequency jitter 202, on the other hand, is generally reproduced in the recovered clock signal and is thus generated as part of the recovered data signal 200 as well—in the eye diagram of FIG. 2, this low-frequency jitter 202 manifests visually as a smearing effect, with bit transitions 204 at the 50 ps (picosecond) and 150 ps marks in the eye diagram occurring slightly out of phase with each other in accordance with the magnitude of the jitter 202. The recovered clock and data signals thus exhibit the same low-frequency jitter 202 as the incoming data signal 100, and this low-frequency jitter 202 is passed on to the next link in the communication system when the recovered data signal 200 is retransmitted on to the destination node.

In practice, a typical traditional repeater circuit exhibits a substantial amount of jitter transfer at jitter frequencies below and around the bit-rate (BR) of the transmission divided by 1667. Between BR/1667 and 10×BR/1667, very little jitter is filtered out by a typical traditional repeater. For example, in a communication system carrying a 10 Gigabit-per-second (10 Gbps) transmission, the band from 600 KHz to 600 MHz will exhibit significant jitter transfer, which may be only partially tracked by a typical receiver in an Application-Specific Integrated Circuit (ASIC).

Without the ability to track jitter, a digital signal receiver can generally tolerate jitter magnitude equal to ½ of the duration of a cycle of the clock signal used to sample the digital data signal. If jitter magnitude exceeds this amount, the phase of the digital data signal may be increased or decreased so much that the clock signal used to sample the data signal reads the previous or subsequent bit of the data signal, thereby generating bit errors. In FIG. 1 and FIG. 2, for example, the illustrated signals 100, 200 have a clock cycle duration of 100 picoseconds. When sampling the input signal 100 of FIG. 1 at approximately the 100 picosecond mark (i.e. the middle of the clock cycle) to generate the recovered data signal 200 of FIG. 2, a bit error could result from any jitter that altered the phase of the data signal so as to push the bit transition at approximately 50 ps rightward or the bit transition at approximately 150 ps leftward past the 100 ps point marking roughly the middle of the clock cycle. Thus, any jitter on this signal greater than approximately 50 ps in magnitude, or ½ of the clock cycle duration, could generate a bit error.

Figure 3:
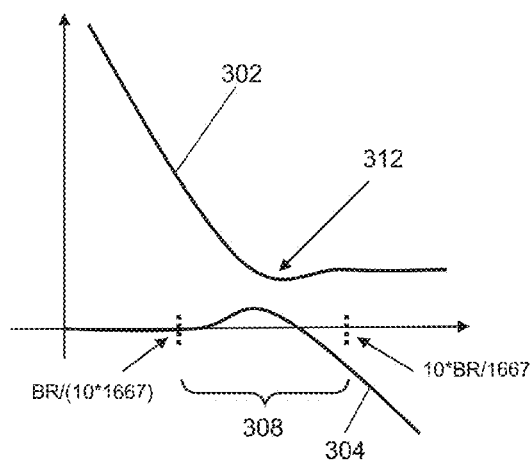
FIG. 3 is a graph of the jitter tolerance and jitter tracking functions of an example traditional repeater, with frequency (measured in Herz) increasing along the horizontal axis and magnitude of jitter (measured in clock cycles) increasing along the vertical axis.
Figure 4:
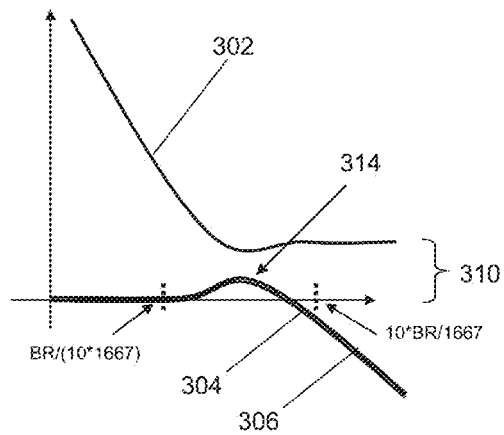
FIG. 4 is a graph of the jitter tolerance, jitter tracking, and jitter transfer functions of an example traditional repeater, with frequency (measured in Herz) increasing along the horizontal axis and magnitude of jitter (measured in clock cycles) increasing along the vertical axis.

FIG. 3 and FIG. 4 graph jitter tolerance 302, jitter tracking 304, and jitter transfer 306 curves of a system having a repeater circuit with jitter tracking capability. The jitter frequency (measured in Herz) is indicated logarithmically on the horizontal axis and the jitter magnitude (measured in clock cycles) is indicated on the vertical axis. At low frequencies (less than frequency BR/(10×1667) in the diagram) the jitter tolerance 302 of the system is very high, as low-frequency jitter of very high magnitude can be tracked successfully by both the repeater and by a receiver at the destination node. In the critical area 308 of the jitter frequency domain, between BR/(10×1667) and 10×BR/1667, where jitter is very likely to manifest, the jitter tolerance 302 of the system falls to a low point 312 due to the relatively high magnitude of jitter transfer 306 combined with the decreased capability of the repeater and the receiver to track jitter 304. At higher frequencies (greater than 10×BR/1667) the jitter tolerance remains low due to the inability of the jitter tracking components of the repeater to track the jitter, and limiting the system to its inherent jitter tolerance 302 magnitude of ½ of a clock cycle duration 310.

Figure 5:
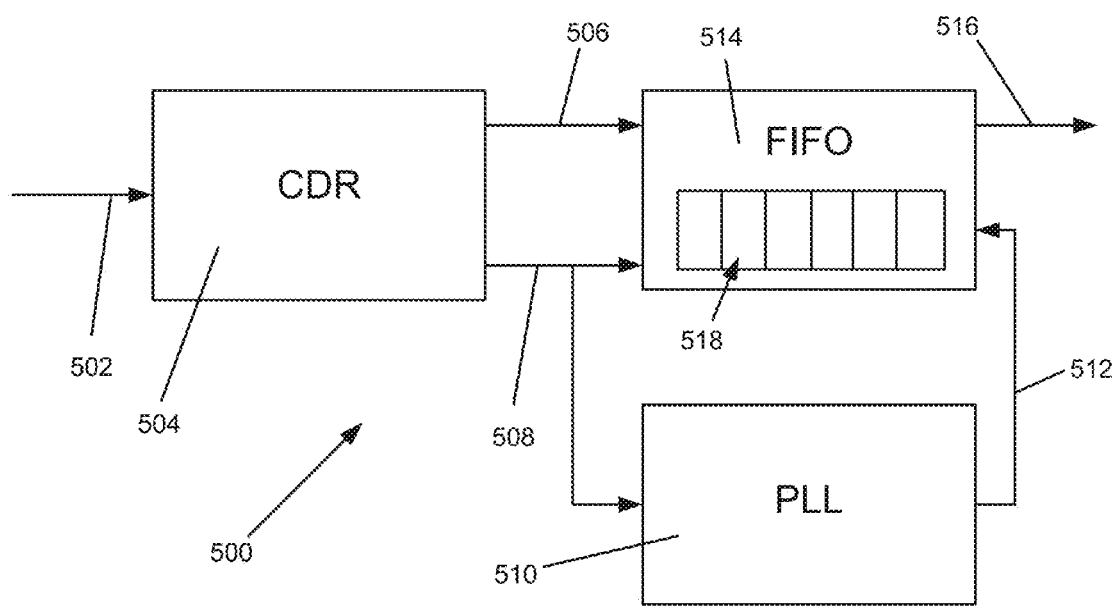
FIG. 5 is a block diagram of an example repeater with jitter termination using a PLL to generate a filtered clock signal.

A repeater circuit can make use of jitter termination components, allowing it to track jitter in an input signal but eliminate this jitter from the signal relayed to the next link in the communication system. An example repeater circuit 500 using a PLL as one of its jitter termination components is illustrated in FIG. 5. Here, the input signal 502 is received by a CDR (Clock and Data Recovery) stage 504 that performs the same role as the first stage of a traditional repeater circuit as described above: it extracts a recovered data signal 506 and a recovered clock signal 508 from the input signal. In this repeater circuit, however, these two signals produced by the CDR stage 504 are fed into further components designed to terminate the jitter in the signals before retiming the output data signal and relaying it to the downstream link in the communication system.

The recovered clock signal 508 and the recovered data signal 506 are fed into a FIFO (First In, First Out) digital memory component 514 having multiple memory registers (such as switches or flip-flops). The FIFO component 514 stores incoming bits of the recovered data signal 506 in a FIFO memory buffer, wherein the oldest stored bit is pushed out by the newest incoming bit.

The recovered clock signal 508 is also fed into a PLL 510 that acts as a low-pass filter that effectively filters jitter out of the recovered clock signal 508, thereby producing a low pass filtered clock signal 512.

Figure 6:
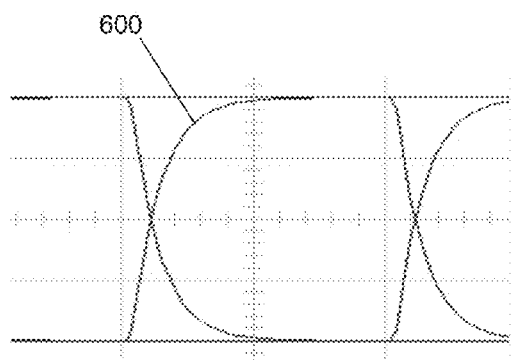
FIG. 6 is an eye diagram of an example output data signal generated by an example repeater with jitter termination.

This low pass filtered clock signal is in turn fed into a further input of the FIFO component 514 and used to sample from the FIFO memory buffer 518. As long as the magnitude of the jitter on the input signal 502 does not exceed the depth of the FIFO memory buffer 518 (i.e., as long as the depth of the FIFO memory buffer 518 equals or exceeds the number of clock cycles by which the phase of the input signal 502 has been distorted by jitter), the low pass filtered clock signal 512 can be compared to the recovered clock 508, with the delay in clock cycles (i.e., the skew) between the two clocks used as an index to access the correct memory register (flip-flop) in the FIFO component 514 and generate a jitter-free, cleaned reconstructed data signal 516. This indexing based on clock skew is implemented in some embodiments by writing bits of the data signal 506 to the FIFO buffer 518 at the left side using the unfiltered recovered clock 508, and reading bits from the right side of the FIFO buffer 518 into a cleaned reconstructed data signal 516 using the filtered clock signal 512. This cleaned reconstructed data signal 516 can then be relayed to the next link in the communication system. FIG. 6 is an eye diagram of an example cleaned reconstructed data signal 600.

Figure 7:
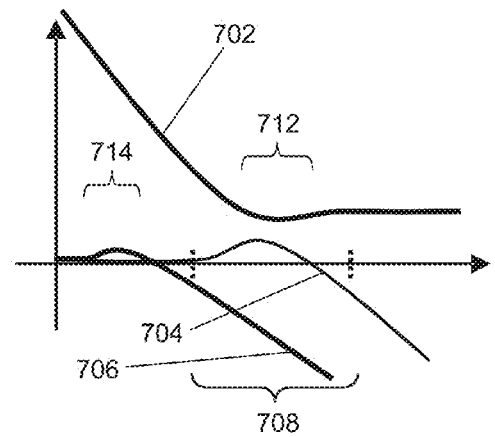
FIG. 7 is a graph of the jitter tolerance and jitter transfer functions of an example repeater with jitter termination, with frequency (measured in Herz) increasing along the horizontal axis and magnitude of jitter (measured in clock cycles) increasing along the vertical axis.

A further benefit of jitter termination using a PLL 510 is the mitigation of jitter amplification that attends the jitter tracking capability of traditional repeaters. The graphs of jitter tracking 304 and jitter transfer 306 for traditional repeaters in FIG. 3 and FIG. 4 show a slight upward bump 314 around the middle of the critical ASIC jitter frequency range, and the graph of jitter tolerance 302 in these figures has a corresponding downward bump 312 in the same frequency region. This increase in jitter tracking 304 and jitter transfer 306 is the result of jitter peaking which results from overshoot by the jitter tracking components of the circuit, such as the feedback loop used in the PLL 510. The use of a second-order PLL is typically required in this type of circuit to provide the proper bandwidth, and the voltage-controlled oscillator (VCO) used by the second-order PLL can introduce additional noise into the feedback loop, resulting in overshoot and jitter peaking (i.e., the introduction of additional jitter due to sampling clock errors by the PLL feedback loop caused by overshoot). Where jitter tracking 304 and jitter transfer 306 are amplified by this additional jitter from the PLL, the jitter tolerance 302 of the system is correspondingly decreased. In a traditional repeater, this amplification occurs in the middle of the critical ASIC jitter frequency range 308, logarithmically centered approximately on the frequency BR/1667. In a repeater with jitter termination 500, however, the decoupling of jitter tracking from jitter transfer 706 means that while jitter tracking 704 occurs in the same frequency range 712 as a traditional repeater, jitter transfer 706 peaks instead in a low frequency range 714 outside of the critical ASIC jitter frequency range 708, as shown in FIG. 7. When this jitter is transferred to the destination node, the peaking occurs in the low-frequency range 714 where the jitter tolerance of the destination node is generally high, rather than the mid-band peaking in range 712 of a traditional repeater.

The use of a PLL 510 as a low pass filter in the above-described repeater circuit 500 comes at a significant price. Each PLL 510 used in a circuit is expensive and occupies a great deal of surface area on a circuit die. Accordingly, example embodiments are described below that achieve jitter termination without the use of a PLL 510. In addition to the savings in price and die area, at least some of the embodiments described below exhibit the further trait of eliminating the jitter peaking effect of the repeater 500 described above, thereby further reducing jitter transfer relative to a traditional repeater.

Figure 8:
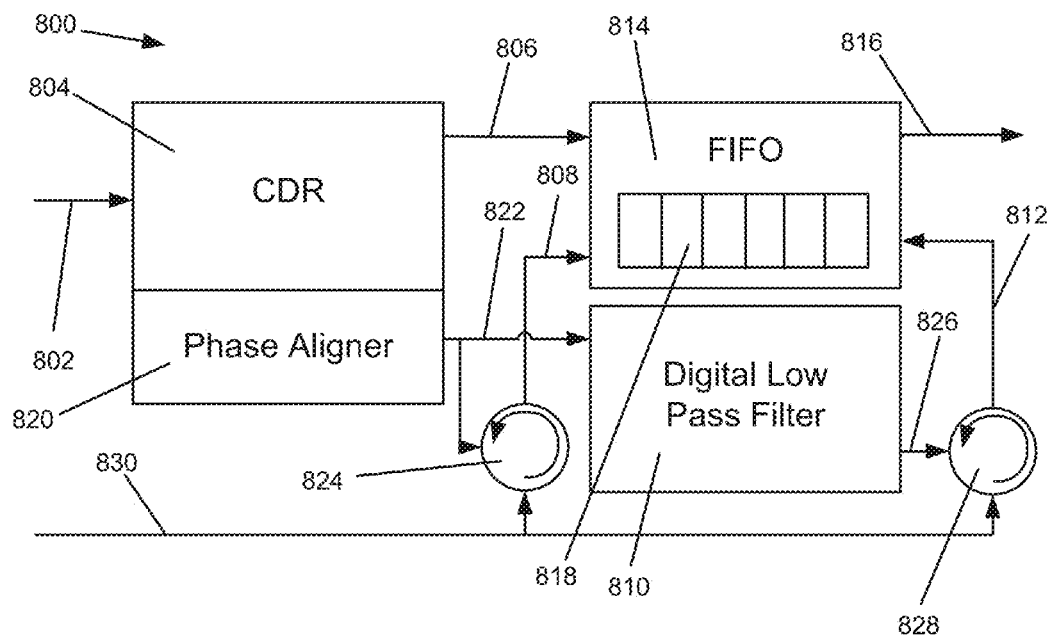
FIG. 8 is a block diagram of an example repeater with jitter termination in accordance with an example embodiment of the invention, using a phase aligner, a digital low pass filter, and two phase interpolators to generate a filtered clock signal.

FIG. 8 shows a block diagram of an example embodiment of a repeater circuit 800 exhibiting jitter termination without the use of a PLL. This embodiment does not filter the recovered clock signal directly, but instead generates a digital phase code from the clock signal and filters this phase code using a digital low pass filter to achieve jitter termination. A CDR 804 receives an input signal 802 and generates a recovered data signal 806. Instead of directly generating a recovered clock signal 808, the CDR 804 uses a phase aligner 820 to find the center of each symbol of the input signal 802 and use this information to generate a digital unfiltered interpolator code 822 encoding the change in phase from one clock cycle of the input signal to the next. In some embodiments, this unfiltered interpolator code is encoded as a multi-bit digital word. This unfiltered interpolator code 822 is relayed to a reception phase interpolator 824, which interpolates the (digital) unfiltered interpolator code 822 and uses it to generate an (analog) recovered clock signal 808.

The unfiltered interpolator code 822 is also received by a digital filter 810, which performs digital low pass filtering on the unfiltered interpolator code to produce a filtered interpolator code 826 encoding only very low-frequency changes in the phase of the input signal 802. The filtered interpolator code 826 is received by a transmission phase interpolator 828, which uses it to generate a filtered clock signal 812 having only very low-frequency jitter. Both phase interpolators 824, 828 use as their reference a shared timebase clock 830 generated by a clock multiplier unit (CMU) to generate their output clock signals 808, 812. In some embodiments, the two phase interpolators 824, 828 are phase rotators that rotate at the same rate, such as 64 phase steps per clock unit interval (UI). The example rate of 64 phase steps per UI would provide control over the sampling position of the clock to within $1/64^{th}$ of a UI. In some embodiments, the degree of resolution provided by the rotator rate is no smaller than the largest jitter exhibited by the system, as any finer resolution (i.e. greater precision of sampling position control) would not provide a benefit in the presence of jitter of the same magnitude.

The recovered data signal 806, the recovered clock signal 808, and the filtered clock signal 812 are all received by a FIFO memory component 814. This FIFO memory component 814 stores the bits of the recovered data signal in a first-in-first-out array of memory registers 818 and generates an output data signal 816 by selecting bits from the memory registers 818 based on an index generated by the delay in clock cycles (skew) between the recovered clock signal 808 and the filtered clock 812. As in the embodiment described with regard to FIG. 5, this indexing based on clock skew is implemented in some embodiments by writing bits of the data signal 806 to the FIFO buffer 814 at the left side using the unfiltered recovered clock signal 808, and reading bits from the right side of the FIFO buffer 818 into an output data signal 816 using the filtered clock signal 812.

Figure 9:
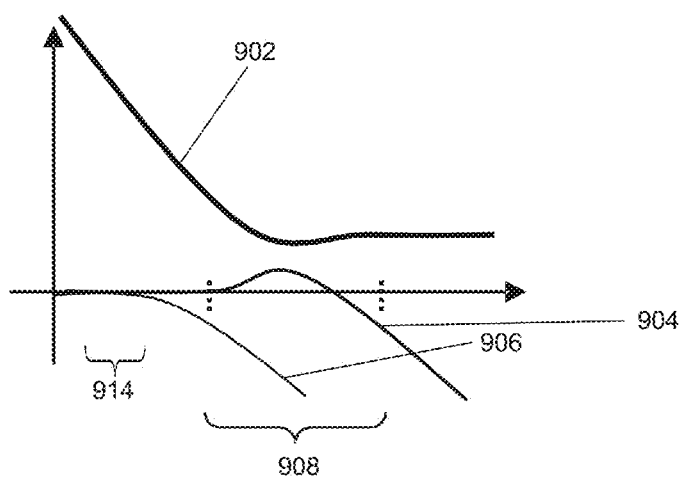
FIG. 9 is a graph of the jitter tolerance and jitter transfer functions of the example repeater of FIG. 8, with frequency (measured in Herz) increasing along the horizontal axis and magnitude of jitter (measured in clock cycles) increasing along the vertical axis.

The replacement of a PLL 510 with a digital filter 810 and its associated components, as described in the example embodiments above, may also reduce jitter amplification: some such embodiments not only retain the benefit of pushing the jitter transfer peaking effect outside of the critical ASIC jitter frequency range 308, 708, but also reduce or eliminate jitter peaking altogether due to the use of a feed-forward digital filter rather than a feedback PLL filter, avoiding the noise introduced by a PLL's VCO and the potential to feed back incorrect positioning decisions by the PLL. FIG. 9 graphs jitter tolerance 902, jitter tracking 904, and jitter transfer 906 for a repeater 800 with jitter termination using a digital low pass filter and associated components in accordance with the example embodiments described above. While the jitter tracking curve 904 is comparable to jitter tracking 304, 704 of previously-described repeaters, the use of digital components instead of a PLL to implement jitter termination produces a jitter transfer curve 906 which exhibits no jitter peaking at the low end 914 of the critical ASIC jitter frequency range 908, thereby further increasing jitter budget for this frequency band in the downstream link of the communication system.

In at least some embodiments, the digital filter 810 is a digital low pass filter implemented using very inexpensive and compact components. Other embodiments may use digital filters with other characteristics. Some embodiments allow the digital filter 810 to filter jitter within a programmable bandwidth. In some embodiments, the digital filter 810 implements features such as an initial calibration function; a moving average function; and/or a watch-dog function. Examples of each of these functions are described below.

Figure 10:
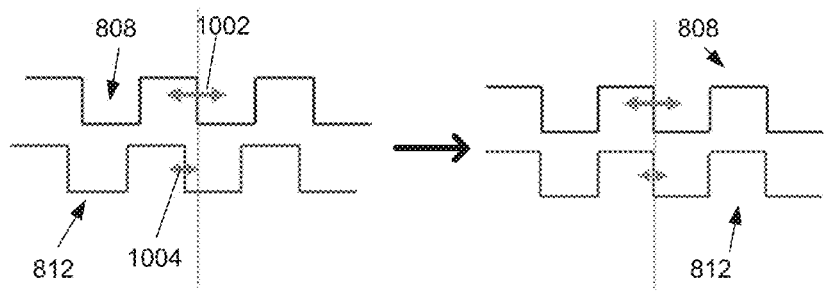
FIG. 10 is pair of signal graphs of the filtered interpolator code and unfiltered interpolator code according to an example embodiment showing the effect of calibration.

Initial calibration can be used by the digital filter 810 to maximize the 2 UI (unit interval) peak-to-peak timing margin. Generally, this calibration requires that the timing margin between the recovered clock signal 808 and the filtered clock signal 812 be a maximum of two clock unit intervals. Calibration can be used to center the filtered interpolator code 826 on the unfiltered interpolator code 822 by first estimating the vertical offset between the unfiltered interpolator code 822 and the filtered interpolator code 826 (i.e. the phase difference between the filtered and unfiltered clocks), then walking the transmission phase interpolator 828 one phase step at a time to cancel the offset. FIG. 10 shows the effect of initial calibration on the filtered clock signal 812, as the filtered phase interpolator code 826 is walked until the filtered clock signal 812 is in phase with the unfiltered clock signal 808. The unfiltered clock signal 808 exhibits a significant amount of jitter 1002 relative to the amount of jitter 1004 of the filtered clock signal 812. Once the two clock signals are moved into phase with each other, they are moved to the center of the data eye of the input data signal 802.

Figure 11:
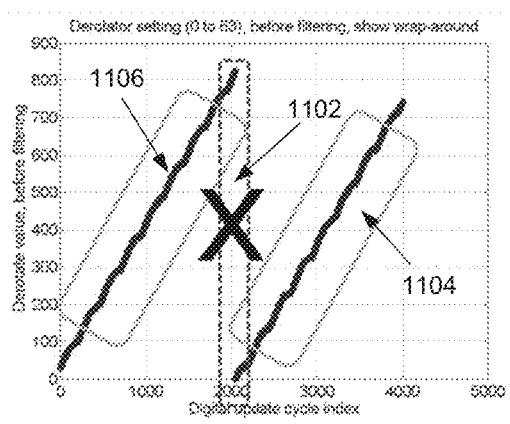
FIG. 11 is a graph of derotator value against a digital update cycle index showing wrap-around in an example repeater circuit without the use of a running average filter function.
Figure 12:
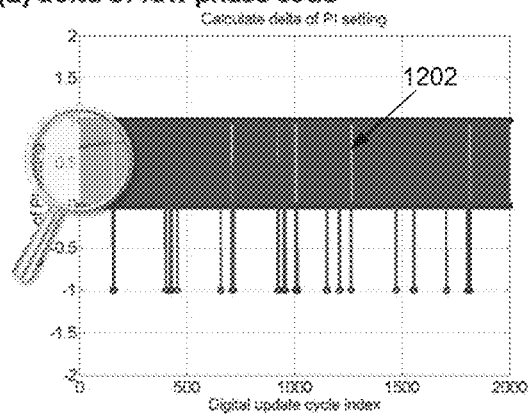
FIG. 12 is a graph of the delta of the unfiltered interpolator code according to an example embodiment over time.
Figure 13:
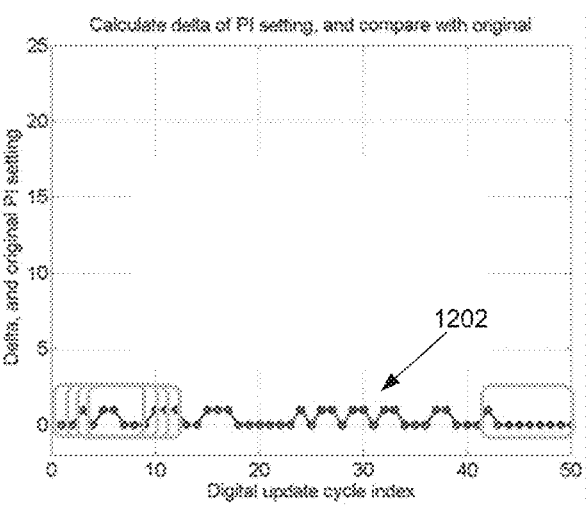
FIG. 13 is a graph of the running average of the delta from FIG. 12 as maintained according to an example embodiment.

A running average function can be used by the digital filter 810 to ensure trend tracking and unbiased smoothing. At least two different methods of filtering using a running average function are usable in different embodiments. The first integrates the phase steps of the reception phase interpolator 824 to determine a reception phase ramp, then applies a running average function to the reception phase ramp to smooth it out, using the resulting smoothed phase ramp for the filtered interpolator code 826. The second method first applies a running average function to the phase steps of the reception phase interpolator 824 to smooth them, then integrates the smoothed reception phase steps, using the resulting smoothed phase ramp for the filtered interpolator code 826. Both approaches solve the problems of wrap-around at the end of a phase ramp and the requirement of using a long word-length for the interpolator code. FIG. 11 illustrates the problem of wrap-around where the phase ramp 1106 becomes discontinuous at point 1102 before resuming as phase ramp 1104. FIG. 12 illustrates the delta 1202 of the unfiltered interpolator code 822 over time, while FIG. 13 illustrates the running average of the delta from FIG. 12 as maintained according to the second method described above. This second method, where a running average of delta phases is calculated before integration of the smoothed delta phases, may be used when both the filtering is linear and the integration is linear. Such linear process is guaranteed, by using sufficient bits, to represent each delta-phase code, in order to prevent any integration of quantization noise. By implementing the interpolator codes 822, 826 as running averages 1302, the number of bits required for the interpolator code words is minimized.

A watch-dog function can be used by the digital filter 810 to immediately disable filtering in order to walk to unfiltered operation graciously. The watch-dog function of the digital filter 810 monitors the difference in magnitude between the unfiltered interpolator code 822 and the filtered interpolator code 826. When this difference is greater than a predetermined threshold, the watchdog function is triggered, immediately disabling filtering but allowing the system to graciously transition to using the unfiltered interpolator code 822 by allowing the transmission phase interpolator 828 to walk back one phase step at a time until the filtered interpolator code 826 matches the unfiltered interpolator code 822. The watch-dog function can be summarized as follows, where $\Delta\phi(n)$ is the phase difference of a given sample, $\phi_{Tx}(n)$ is the phase of the filtered interpolator code, and $\phi_{Rx}(n)$ is the phase of the unfiltered interpolator code:

1. Monitor $\Delta\phi(n) = |\phi_{Tx}(n) - \phi_{Rx}(n)|$ for all $n$

2. Trigger $\Delta\phi(n) >$ threshold

3. Disable filtering, start walk back, then use Rx code $\phi_{Tx}(n) \rightarrow \phi_{Rx}(n)$ $\delta\phi(n) = 1$ $\Sigma\delta\phi(n) =$ threshold (in phase steps)

$\phi_{Tx}(n) = \phi_{Rx}(n)$

Figure 14:
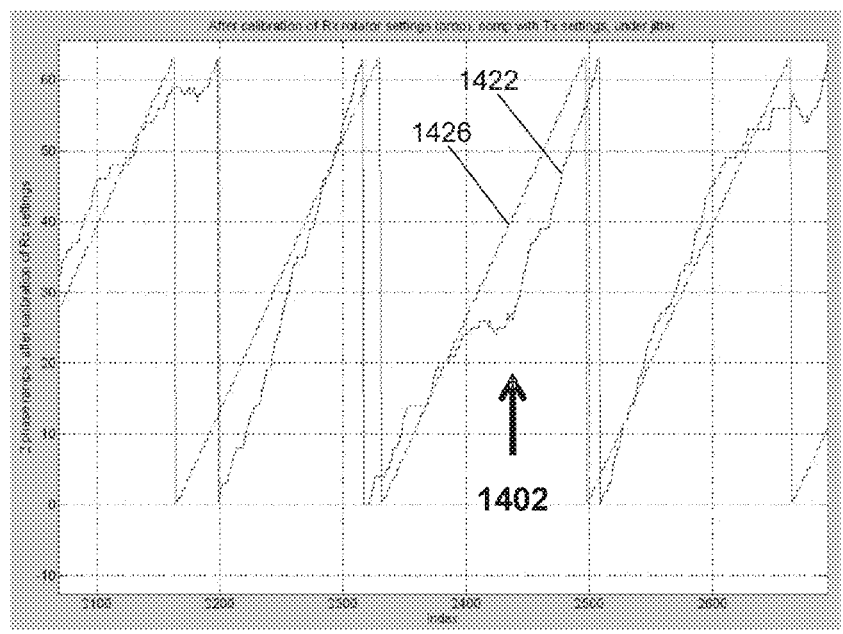
FIG. 14 is a graph of an example sequence of phase ramps according to an example embodiment.

FIG. 14 shows an example sequence of phase ramps wherein the difference in magnitude between the unfiltered interpolator code 1422 and the filtered interpolator code 1426 has fallen below a threshold of 2 UI (at point 1402).

In some embodiments, the jitter termination features of the repeater circuit 800 can be disabled altogether, allowing full jitter transfer.

Figure 15:
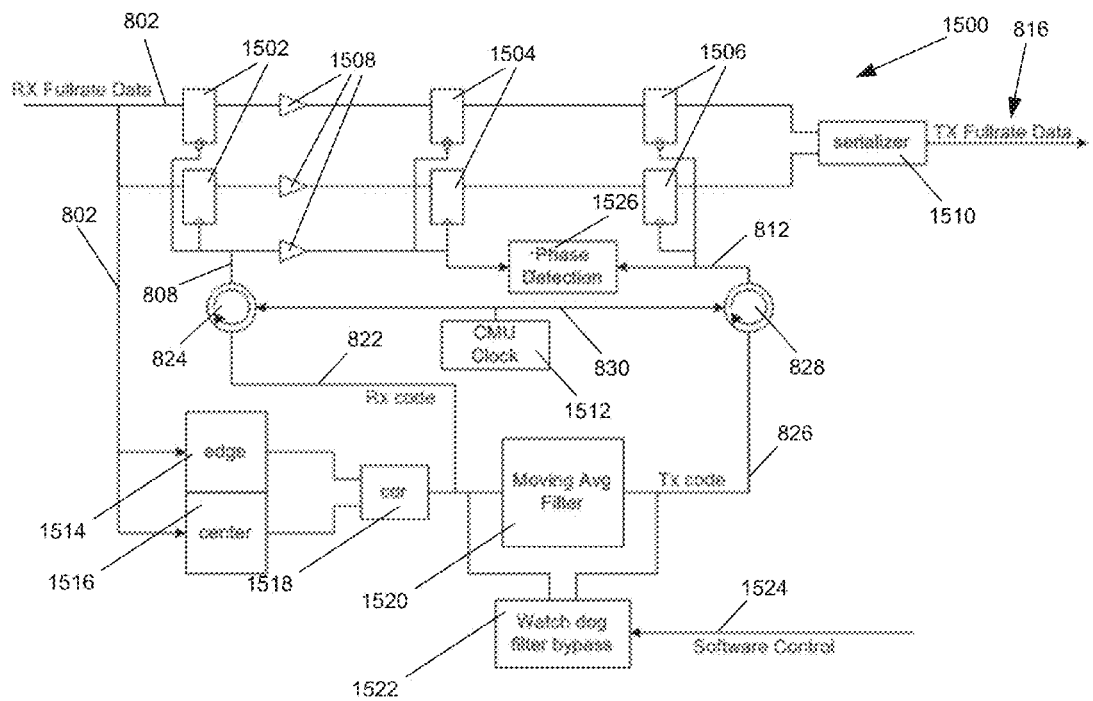
FIG. 15 is a simplified circuit diagram of a low-latency repeater circuit with jitter termination according to an example embodiment.

FIG. 15 shows an example embodiment of a low-latency repeater circuit 1500 having some of the additional filter components described above. The input signal 802 is received by the circuit and passed through directly to a first flip-flop 1502 operating as the leftmost register of the FIFO buffer 814. The input signal 802 is also received by an edge detector 1514 and a center detector 1516, whose output is used by a CDR component 1518 to generate the unfiltered interpolator code 822. This combination of the input signal 802 pass-through, the edge detector 1514, the center detector 1516, and the CDR module 1518 performs the same function as the CDR 804 and phase aligner 820 of the simplified embodiment shown in FIG. 8. Similarly, the digital low-pass filter 810 of FIG. 8 is implemented here by the combination of moving average filter 1520 and watchdog filter bypass 1522, which take the unfiltered interpolator code 822 and either filter it through the moving average filter 1520 or bypass the moving average filter to pass through the unfiltered signal when the watchdog filter bypass 1522 is triggered. As described above, this bypass 1522 may in some embodiments be triggered by a phase difference (between the unfiltered 822 and filtered 826 interpolator codes) greater than a preset threshold, causing the watch-dog filter bypass 1522 to graciously walk the filtered code 826 back to the phase of the unfiltered code 822.

Figure 16:
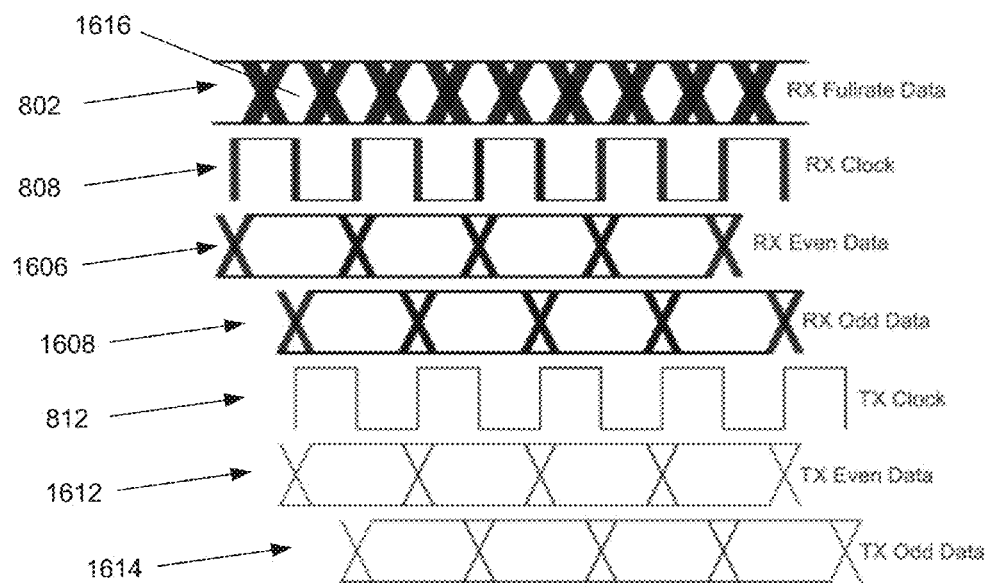
FIG. 16 is a diagram comparing the full-rate input data signal, unfiltered clock signal, even input data signal, odd input data signal, filtered clock signal, even output data signal, and odd output data signal in the example low-latency repeater circuit of FIG. 15.

As in the simplified embodiment shown in FIG. 8, the unfiltered interpolator code 822 is received by reception phase interpolator 824, while the filtered interpolator code 826 is received by transmission phase interpolator 828. Both of these phase interpolators 824, 828 use a CMU clock signal 830 produced by the CMU clock 1512. The unfiltered clock signal 808 produced by the reception phase interpolator 824 is used to write the value of the input signal 802 to the first flip-flop 1502. In this embodiment, the low-latency repeater circuit 1500 operates at half the data rate of the input signal, so one flop of the first flip-flop 1502 is written on a rising edge of the unfiltered clock signal 808, while the other flop is written on the falling edge. FIG. 16, which illustrates the operation of the half-rate data operations, is described in greater detail below.

Buffers 1508 introduce delay into the propagation of data and clock signals from the first flip-flop 1502 and the unfiltered clock signal 808, respectively, to a second flip-flop 1504. This delay matches the delay introduced by the operation of the clock filtering and reconstructions components, thereby synchronizing the operation of the entire circuit. The second flip-flop 1504 is overwritten with the values of the first flip-flop 1502 based on the rising and falling edges of the delayed unfiltered clock signal 808.

Phase detection module 1526 detects the phase difference between the delayed unfiltered clock signal 808 and the filtered clock signal 812. This phase difference may be used in some embodiments by a software control module 1524 (such as firmware for an embedded system) to activate or deactivate the watch-dog filter bypass 1522. The detected phase difference is also used during initial calibration, as described above.

As in the simplified embodiment of FIG. 8, the filtered clock signal 812 is used to read the right-most register of the FIFO 814, implemented in this embodiment as a third flip-flop 1506. The bits are read out of one flop on the rising edge of the filtered clock signal 812, and out of the other flop on the falling edge, and this half-rate data is then serialized back to full rate by a serializer module 1510 to produce output signal 816.

The operation of the half-rate data propagation of an example low-latency repeater circuit 1500 is shown in FIG. 16. The rising and falling edges of the unfiltered clock signal 808 are synchronized to the centers of the symbols 1616 of the input signal 802. One of the flops of the first flip-flip 1502 is written with the value of the reception even data 1606, which has symbols spanning two cycles (2 UI) of the unfiltered clock signal 808, based on the rising edges of the unfiltered clock signal 808. The second flop of the first flip-flip 1502 is written with the value of the reception odd data 1608 based on the falling edges. Similarly, one of the flops of third flip-flip 1506 is read out as the value of the transmission even data 1612 based on the rising edges of the filtered clock 812, while the second flop is read out as the value of transmission odd data 1614 based on the falling edges.

Figure 17:
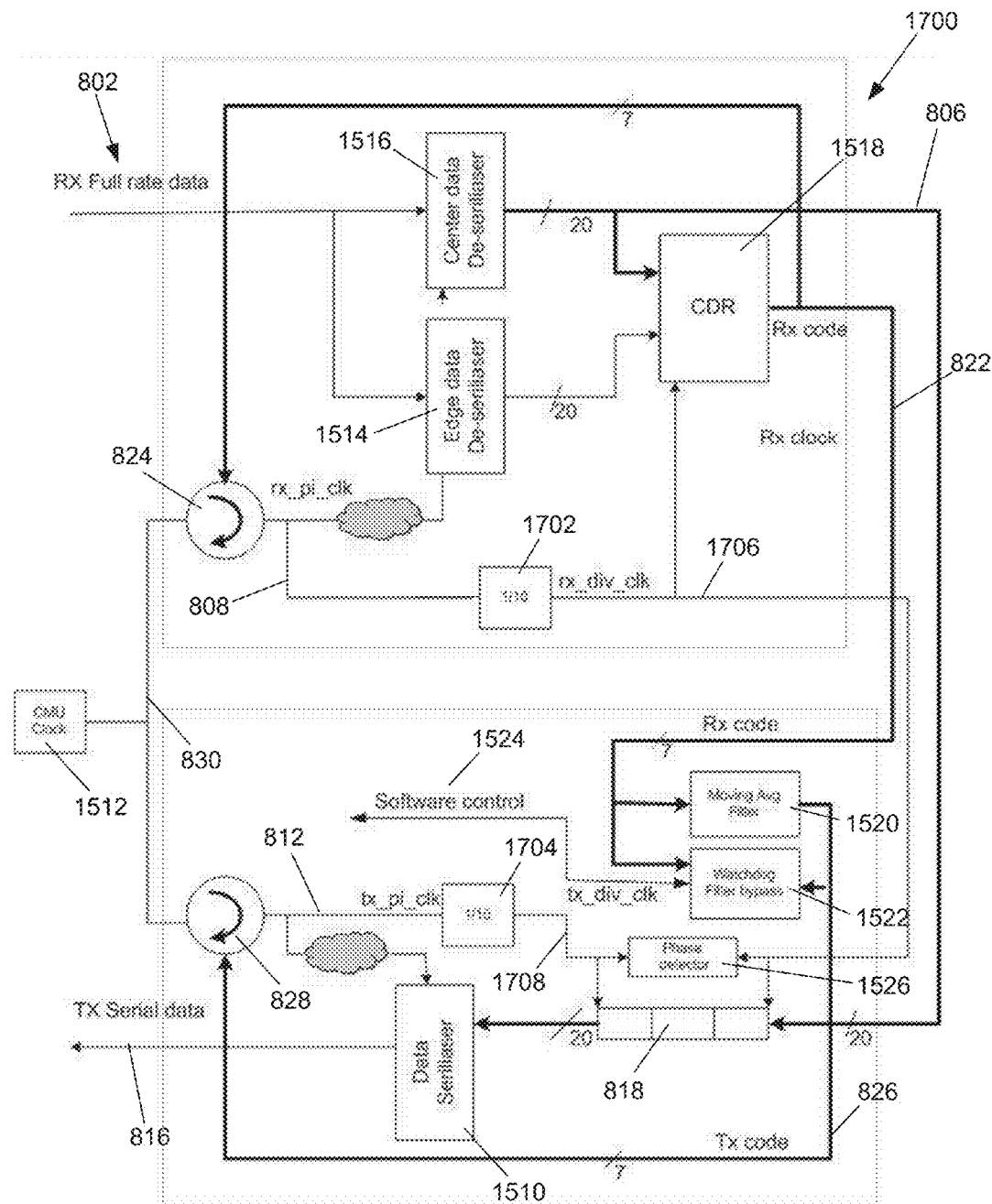
FIG. 17 is a simplified circuit diagram of a high-latency repeater circuit with jitter termination according to an example embodiment.

An alternate embodiment is illustrated in FIG. 17, which shows a high-latency repeater circuit 1700 operating at $\frac{1}{20}^{th}$ the clock rate of the input signal 802. Because the incoming data has to be multiplexed to 20 parallel paths and re-serialized before being transmitted, the latency of this circuit is significantly higher than the previously-described low-latency embodiment 1500. This embodiment makes use of a 20-channel-wide bus to carry the unfiltered data signal 806, the output signals of the edge de-serializer 1514 and the center de-serializer 1516, and the output of the FIFO 818 to the data serializer 1510. The FIFO 818 itself is a 20-bit-wide series of flip-flops, in contrast to the two-bit-wide series of flip-flops 1502, 1504, 1506 in the embodiment of FIG. 15. Like the embodiment of FIG. 15, this embodiment also runs at half the data rate of the incoming signal, as shown in FIG. 16. Since the bus in this embodiment is ten times wider than the two-bit-wide bus of FIG. 15, the unfiltered clock signal 808 and the filtered clock 812 are divided down by ten by clock dividers 1702, 1704 to produce a divided unfiltered clock 1706 and a divided filtered clock 1708 which are relayed to the CDR module 1518, FIFO 818, and phase detector 1526. This embodiment also shows the buses carrying the interpolator codes 822, 826 being seven bits wide, thereby able to accommodate a seven-bit phase interpolator code word.

Some embodiments may make use of one or more of the digital filter components to directly filter the clock signal, rather than using operating upon interpolator codes. Such embodiments may realize savings in cost and die space relative to PLL-based implementations of jitter termination, but these savings may be diminished, and they may not exhibit the same increase in jitter budget as embodiments that filter interpolator codes.

Figure 18:
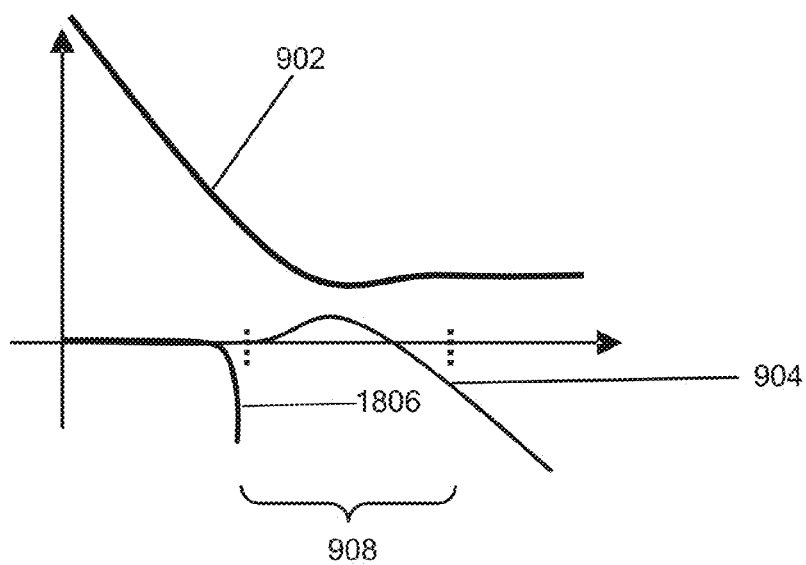
FIG. 18 is a graph of the jitter tolerance and jitter transfer functions of an example repeater circuit with jitter termination using a dead-band filter, with frequency (measured in Herz) increasing along the horizontal axis and magnitude of jitter (measured in clock cycles) increasing along the vertical axis.

In some embodiments, jitter termination may be implemented in a synchronous system using a dead-band or brick-wall filter. A synchronous system that has access to the same clock used by the input data signal 802 would be able to completely eliminate jitter in the critical ASIC midband frequency range by setting the pole of its filter sufficiently low, thereby creating a dead-band filter. The effect of such a filter on the jitter transfer of the circuit is illustrated in FIG. 18. The jitter transfer curve 1806 drops off at the low end of the critical ASIC frequency range 908, as all of the jitter in this frequency range is eliminated from the interpolator code by the dead-band filter.

The embodiments described herein are examples of structures, systems or methods having elements corresponding to the elements of the invention recited in the claims. This written description may enable those skilled in the art to make and use embodiments having alternative elements that likewise correspond to the elements of the invention recited in the claims. The intended scope of the invention thus includes other structures, systems or methods that do not differ from the literal language of the claims, and further includes other structures, systems or methods with insubstantial differences from the literal language of the claims.

The invention claimed is:

1. A circuit for reducing jitter in a digital signal, comprising:
    a clock and data recovery stage comprising:
        a data recovery stage operative to receive an input data signal and generate in response thereto a recovered data signal;
        a component operative to receive the input data signal and generate in response thereto an unfiltered interpolator code, the unfiltered interpolator code encoding the change in phase of the input data signal over time from one clock cycle of the input data signal to the next clock cycle; and
        a first phase interpolator stage operative to receive the unfiltered interpolator code and generate in response thereto a recovered clock signal;
    a filter stage comprising:
        a filter operative to receive the unfiltered interpolator code and generate in response thereto a filtered interpolator code encoding low-frequency changes in the phase of the input signal; and
        a second phase interpolator operative to receive the filtered interpolator code and generate in response thereto a filtered clock signal encoding the clock signal of the input data signal filtered of high-frequency phase jitter;
    a first-in-first-out (FIFO) memory component having a queue of memory registers, wherein the FIFO memory component is coupled to the clock and data recovery stage and the filter stage, the FIFO memory component operative to:
        alternatively store even data and odd data of the recovered data signal using the recovered clock signal, wherein the even data and odd data is stored at a date rate that is half of the data rate of the input data signal; and
        generate an output data signal by selecting stored data from the memory registers using the filtered clock signal, wherein the selected data is serialized to generate the output signal at the data rate of the the input data signal.

2. The circuit of claim 1, wherein the clock and data recovery stage receives the input data signal from a first communication link and the FIFO memory component relays the output data signal to a second communication link.

3. The circuit of claim 1, wherein the recovered data signal encodes the data carried on the input data signal.

4. The circuit of claim 1, wherein the recovered clock signal has a phase matching the phase of the recovered data signal.

5. The circuit of claim 1, wherein the memory component stores bits sampled from the recovered data signal at an input end of the FIFO memory component, and stored bits are selected from an output end of the FIFO memory component.

6. The circuit of claim 1, further comprising a timebase clock used by the first phase interpolator and the second phase interpolator to generate the recovered clock signal and the filtered clock signal, respectively.

7. A method for reducing jitter in a digital signal, comprising:
receiving an input data signal;
generating a recovered data signal, and an unfiltered interpolator code based on the input data signal, the unfiltered interpolator code encoding the change in phase of the input data signal over time from one clock cycle of the input data signal to the next clock cycle;
generating a recovered clock signal based on the unfiltered interpolator code;
generating a filtered interpolator code encoding low-frequency changes in the phase of the input signal based on the unfiltered interpolator code;
generating a filtered clock signal encoding the clock signal of the input data signal filtered of high-frequency phase jitter based on the filtered interpolator code;
alternatively storing even data and odd data of the recovered data signal using the recovered clock signal, wherein the even data and odd data is stored at a date rate that is half of the data rate of the input data signal; and
generating an output data signal by selecting stored data using the filtered clock signal, wherein the selected data is serialized to generate the output signal at the data rate of the the input data signal.

8. The method of claim 7, wherein the input data signal is received—from a first communication link and comprising the further step of relaying the output data signal to a second communication link.

9. The method of claim 7, wherein the recovered data signal encodes the data carried on the input data signal.

10. The method of claim 7, wherein the recovered clock signal has a phase matching the phase of the recovered data signal.

11. The method of claim 7, wherein bits sampled from the recovered data signal are stored at an input end of a FIFO memory component, and stored bits are selected from an output end of the FIFO memory component.

12. The method of claim 7, wherein a timebase clock is used to generate the recovered clock signal and the filtered clock signal, respectively.

13. The circuit of claim 1, wherein to generate the output data signal, stored bits are selected from the memory registers based on an index generated by a delay in clock cycles between the recovered clock signal the filtered clock signal.

14. The circuit of claim 13, wherein the delay matches a delay introduced by the clock and data recovery stage and filter stage.

15. The circuit of claim 1, wherein the memory registers are flip-flop memory registers, and wherein the even data and odd data of the recovered data signal are alternatively stored to different flops of a flip-flop memory register.

16. The circuit of claim 1, wherein the FIFO memory component comprises a first memory component operative to receive the recovered data signal and the recovered clock signal as inputs, and to store even data on a rising edge of the recovered clock signal and to store odd data on a falling edge of the recovered clock signal;
a second memory component operative to receive a delayed data signal output from the first memory component and a delayed recovered clock signal as input, and to store even data on a rising edge of the delayed recovered clock signal and to store odd data on a falling edge of the delayed recovered clock signal;
a third memory component operative to receive a data signal output from the second memory component and the filtered clock signal as input, and to read a value of even data on a rising edge of the filtered dock signal and to read odd data on a falling edge of the filtered clock signal.

17. The circuit of claim 16, further comprising:
buffers operative to delay the data signal output from the first memory component and the recovered clock signal received by the second memory component.

18. The circuit of claim 17, wherein the delay matches a delay introduced by the clock and data recovery stage and filter stage, thereby synchronizing operation of the circuit.

19. The circuit of claim 16, further comprising:
a serializer module operative to receive a data signal output from the third memory component as input and serialize the data signal output to the data rate of the the input data signal to generate the output signal.

20. The circuit of claim 16, wherein the first memory component is a first flip-flop memory register, the second first memory component is a second flip-flop memory register, and the third memory component is a third flip-flop memory register.

21. The circuit of claim 16, further comprising:
a phase detection module operative to detect the phase difference between the delayed recovered clock signal and the filtered clock signal.

* * * * *